United States Patent [19]

Mochiji et al.

[11] Patent Number: 5,305,364
[45] Date of Patent: Apr. 19, 1994

[54] PROJECTION TYPE X-RAY LITHOGRAPHY APPARATUS

[75] Inventors: Kozo Mochiji, Hachioji; Hiroaki Oizumi, Kokubunji; Shigeo Moriyama, Tama; Shinji Okazaki, Urawa; Tsuneo Terasawa, Ome; Masaaki Itou, Higashimurayama, all of Japan

[73] Assignee: Hitachi, Ltd., Tokyo, Japan

[21] Appl. No.: 945,146

[22] Filed: Sep. 15, 1992

[30] Foreign Application Priority Data

Sep. 19, 1991 [JP] Japan .................................. 3-239244

[51] Int. Cl.$^5$ ............................................. G21K 5/00
[52] U.S. Cl. ........................................ 378/34; 378/84; 378/161
[58] Field of Search ............... 378/34, 35, 161, 123, 378/84, 85, 43, 208

[56] References Cited

U.S. PATENT DOCUMENTS

| | | | |
|---|---|---|---|
| 4,539,695 | 4/1985 | La Fiandra | 378/34 |
| 4,862,490 | 8/1989 | Karnezos et al. | 378/161 |
| 5,003,567 | 3/1991 | Hawryluk et al. | |
| 5,063,586 | 11/1991 | Jewell et al. | 378/34 |
| 5,153,898 | 10/1992 | Suzuki et al. | 378/34 |
| 5,173,612 | 12/1992 | Imai et al. | 378/161 |

FOREIGN PATENT DOCUMENTS 0104620  5/1986  Japan .................................. 378/34

OTHER PUBLICATIONS

NTIS Tech Notes No. 7B, Jul. 1985, Springfield, VA US, p. 760 "Advanced X-Ray Lithography for IC Production".

Proceedings of SPIE, vol. 448, 1984, Bellingham, Wash., US, pp. 50–59, Silverman et al, "Synchrotron radiation X-ray lithography: recent results".

Nuclear Instruments & Methods in Physics Research: Section A, vol. A246, No. ⅓, May 1986, Amsterdam, NL, pp. 658–667, Betz, "High Resolution Lithography Using Synchrotron Radiation".

Nuclear Instruments and Methods, vol. 172, 1980, Amsterdam, NL, pp. 387–391, Warburton, "Soft X-Ray Microscopy/Lithography Branch Line At SSRL".

Technical Digest Series, WD2-1, "Soft X-ray Reduction Lithography Using a Reflection Mask", H. Kinoshita et al, 1991, pp. 57–59.

Technical Digest Series, WD2-1, "Soft X-ray Reduction Lithography Using a Reflection Mask", H. Kinoshita et al, 1991, pp. 57–59.

Primary Examiner—David P. Porta
Attorney, Agent, or Firm—Fay, Sharpe, Beall, Fagan, Minnich & McKee

[57] ABSTRACT

Reduction projection type X-ray lithography with an exposing beam wavelength of 40-150A, longer than in conventional 1:1 proximity exposure, has a high-vacuum space. This would reduce wafer replacement work efficiency and contaminate optical mirrors with substances released by a resist decomposed during exposure except for separating an optical system chamber and a wafer exposing chamber by a differential pumping section and a thin-film window. Wafer exposure is under atmospheric pressure, improving productivity, accuracy of exposure and longevity of the optical devices.

19 Claims, 4 Drawing Sheets

PROJECTION TYPE X-RAY LITHOGRAPHY APPARATUS

BACKGROUND OF THE INVENTION

The present invention relates to fabricating a semiconductor device and more particularly to X-ray lithography to form a fine pattern, for example, as used for making highly integrated memory devices.

Efforts have been made to develop X-ray lithography to be used in microfabrication and to be capable of manufacturing future highly integrated LSIs at high production capacity. Until now, development efforts have been focused on a 1:1 method, in which a mask of the same scale as the LSI is replicated. Since the replication performance depends on the mask precision, a reduced projection method is newly proposed in which a beam path intersects an enlarged mask, after, which the beam is reduced and exposed onto wafers. This is described in, for example, Technical Digest Series Volume of Soft-X-ray Projection on Lithography, p. 57-59, 1991. With this reduced projection method, because of the restrictions of a focusing optical system, the wavelength of the X-ray is about 130A, more than ten times longer than that of the conventional 1:1 method. For this reason, an entire system including an optical system and a wafer exposing unit is arranged in one high-vacuum chamber.

SUMMARY

It is an object of the present invention to analyze the prior systems and solve problems associated with them, to provide high efficiency.

As is seen from the above example, in reduced projection type X-ray lithography, since the entire equipment is installed in one vacuum chamber, replacement of wafers takes time. In addition the X-ray lithography has a serious problem that optical devices are contaminated with organic matter released from the resist during exposure.

To solve these problems is an object of the invention. A space for the optical system is separated from a space for exposure of the wafer, and also wafer exposure is carried out at or close to atmospheric pressure. Differential pumping has been considered by the inventors, as used in an electron beam writing system to be applied between the spaces. When an X-ray beam for reduction of a section is used, however, a differential pumping passage cannot be finely narrowed as in the electron beam writing system that uses a small diameter scanning beam, in order to secure an exposing area. As a result, it is difficult to set the wafer chamber at atmospheric pressure and keep the optical system chamber at $10^{-6}$ Torr or less with differential pumping only.

To solve the above drawbacks, a thin film window to transmit an exposing X-ray is provided, preferably to the high-vacuum side of the differential pumping device, to separate the wafer chamber or space from the optical system chamber or space.

If the area of the differential pumping passage is just sufficient to allow exposure (for instance 10 cm$^2$), it is easy to keep the space surrounding the wafer at atmospheric pressure and the low-pressure side of the thin-film window at $10^{-2}$ Torr or less. When the pressure of the low-vacuum side of the thin-film window is $10^{-2}$ Torr, the thin-film window, even as thin as 1 μm, can easily withstand a pressure differential between the low-vacuum side and the high-vacuum side of the optical system at about $10^{-6}$ Torr. This thin window enables practical separation of the two spaces without unduly attenuating the intensity of the exposing X-ray beams. When a multi-layer film material of the optical device includes a chemical element of the thin film, the exposing X-ray reflectivity of the optical device is significantly enhanced and the attenuation of the exposing X-ray intensity caused by the provision of the space separation film is substantially mitigated.

BRIEF DESCRIPTION OF THE DRAWINGS

Further objects, features and advantages of the present invention will become more clear from the following detailed description of a preferred embodiment, shown in the drawing wherein.

DETAILED DESCRIPTION OF THE PREFERRED EMBODIMENT

Figure 1:
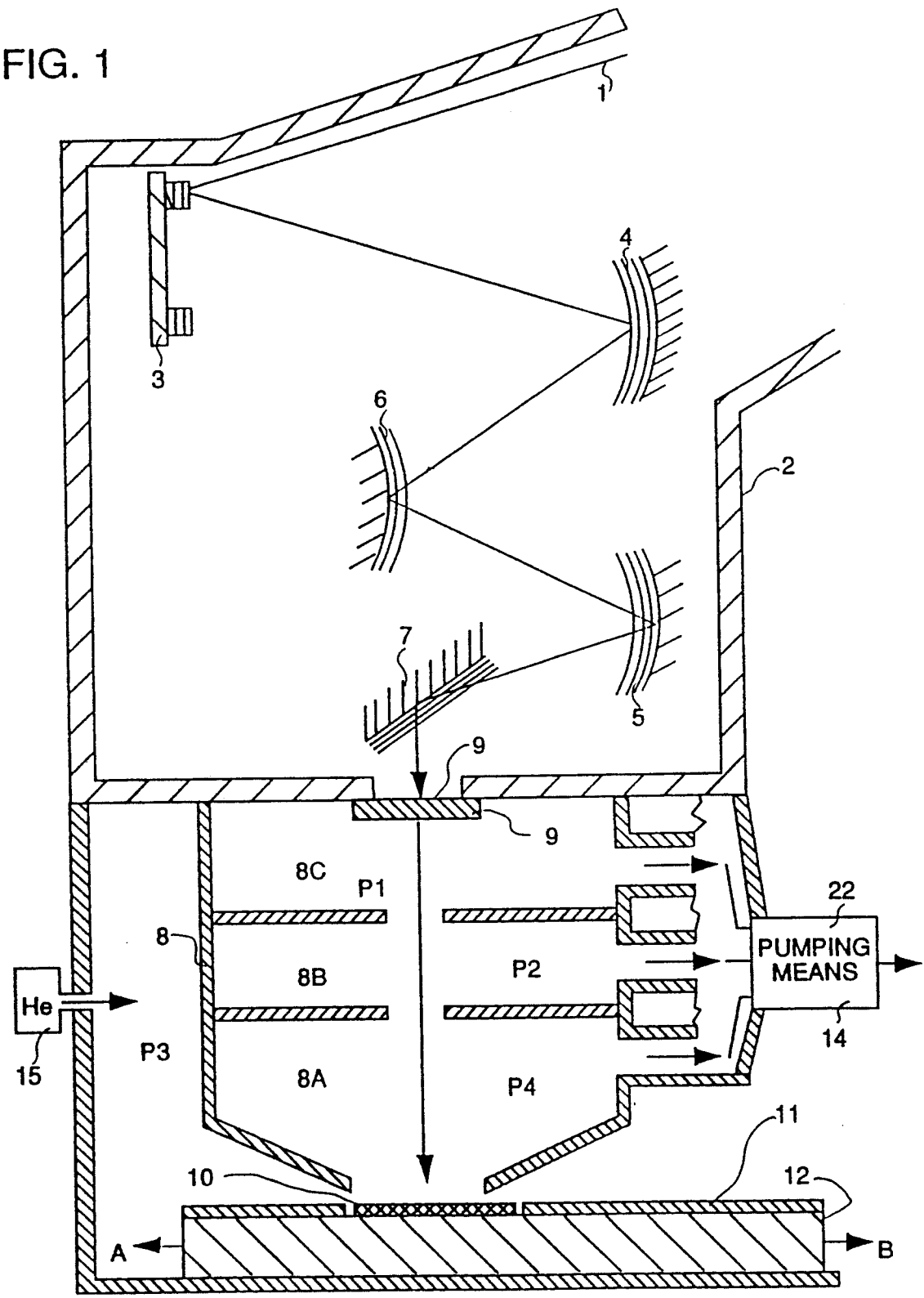
FIG. 1 is a cross sectional view of the X-ray lithography apparatus employed in a first embodiment.

Now, a first embodiment of this invention will be described by referring to FIG. 1. Synchrotron radiation is separated into its spectral components and a soft X-ray 1 monochromatized to a wavelength of 4.5 NM is introduced into an optical chamber 2 and onto an X-ray mask 3. The X-ray mask is a multi-layer film which consists of a SiC substrate coated alternately with tungsten (W) and carbon (C) to 2 nm and 3 nm, respectively, in 50 layers (multi-layer film). The multi-layer film is then dry-etched to form a mask pattern. The focusing optical system has two spherical concave mirrors 4, 5, one spherical convex mirror 6, and one plane mirror 7. All the reflective mirrors are formed at the surface with the same multi-layer film that is used on the X-ray mask.

Figure 3:
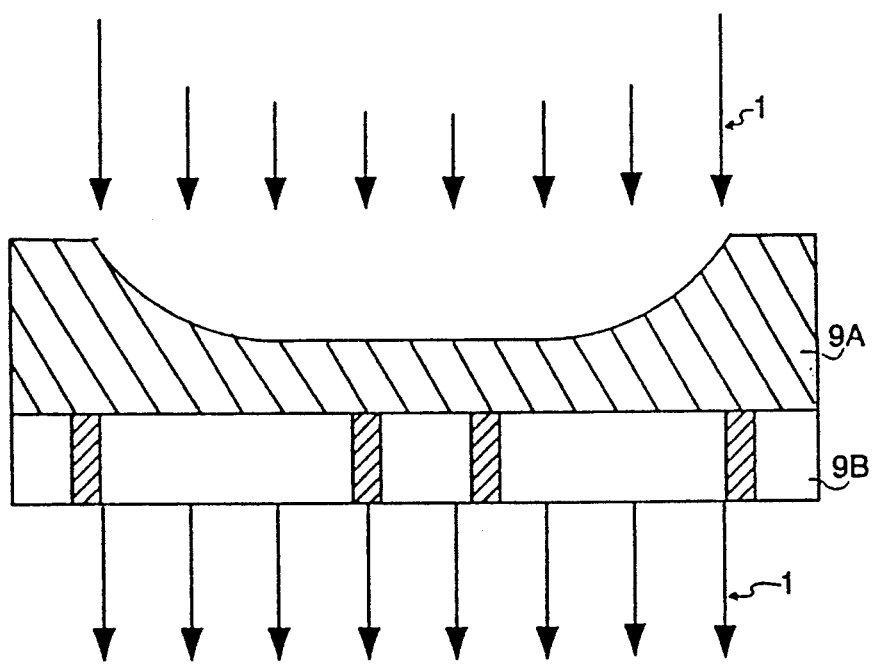
FIG. 3 shows a variation in the construction of the window.

The optical system chamber 3 is separated from a differential pumping section 8 by a diamond, thin film window 9 that is 1 μm thick. The window 9 may be of organic material, inorganic material or metal, and more specifically one or a combination of Be, B, C (diamond), BN, B$_4$C, Si$_2$, SiO$_2$, SiNx, Si$_3$N$_4$ and SiC. The window 9 may have a cross-sectional profile that is a rectangular solid or as in FIG. 3 that is non-uniform in thickness to transmit less, for example up to 10% less, of the X-ray at portions where the optical system 4, 5, 6 and 7 has made the X-ray beam the most intense, to pass a uniform intensity X-ray beam as shown in FIG. 3. The window 9 or 9A may be provided with a grid or support frame 9B, as in FIG. 3, to increase its strength relative to the pressure differential across it without materially affecting its transmission. The optical system chamber 2 is set at $1 \times 10^{-8}$ Torr or less. Outside the differential pumping section 8 is an atmosphere of, for example helium, provided by a gas supply 15, at P3 equals about atmospheric pressure. The gap between the front end (or bottom in FIG. 1) of the differential pumping section 8 and the top surface of a wafer 10 to be exposed is set at 50 μm. The differential pumping section 8 has three compartments 8A, 8B, 8C stacked in the direction of the path of the soft X-ray, which compartments have vacuum levels of P4=1 Torr, P2=$10^{-1}$ Torr and P1=$10^{-2}$ Torr, respectively.

When the wafer 10 is to be replaced after exposure, a stage 12 is moved in the direction B, loaded with a wafer and moved in the direction A so that the front end or input of the differential pumping mechanism 8 aligns with a recess in the retractor 11, which retractor has a top surface that is set to the same height as the wafer top surface to thereby maintain the 50 μm gap at the input of the differential pumping mechanism 8, to thereby keep the pressure differential across the window 9 constant, to prevent damage to the window during sample change.

In the above embodiment, since the space of the optical system chamber 2 and the wafer exposure space are completely hermetically separated, the optical system 3, 4, 5, 6, 7 can be prevented from being contaminated with decomposed substances released during exposure of a resist on the wafer 10. This arrangement also facilitates replacement of wafer samples, improving productivity. The X-ray with a wavelength of 4.5 nm transmits at about 75% transmission through the carbon film of the mask 3 mirrors 4–7 and the separation window's diamond thin film 9, so that the photon density exposing the wafer is $10^3$ times higher than that obtained with the commonly used wavelength of 13.5 nm (about 0.1% transmission).

A second embodiment will be explained by referring to FIG. 2. The construction and arrangement of the X-ray mask and the optical system are identical with those of the first embodiment, except that the reflection mask 3 is replaced by a mirror 13B and a transmission mask 13B. The optical components 13A, 13B, 4, 5, 6, and 7 each have multi-layer films that are formed by alternately coating films of molybdenum and silicon in 20 layers, each 9.5 nm thick. The soft X-ray 1 incident on the mask 13A has a wavelength of 13.5 nm. The optical system chamber 2 and the exposure chamber 3 are separated by a silicon nitride ($Si_3N_4$) film as a separation window 9A.

The $Si_3N_4$ film 9 is 1 μm thick to form the separation window 9A as a circular disc 20 nm in diameter. The space of the optical system, inside the chamber 2 at the top of window 9, is set to a vacuum of P3 at least $1 \times 10^{-8}$ Torr. The exposure chamber 13, contains a conical differential pumping section 8' pulling vacuums of $P1 \times P2$ and the gap between the front end (bottom in the drawing) of the differential pumping section 8' and the wafer 10 is set to 1 nm. As a result, the soft X-ray beam irradiation section immediately above the top surface of the wafer 10 has the vacuum level P4 (substantially equal to P1) of less than the vacuum of chamber 2 ($10^{-8}$ Torr) or preferably $1 \times 10^{-3}$ to $1 \times 10^{-2}$ Torr, the intermediate section 8C has a vacuum of $P2 = 1 \times 10^{-2}$ to $1 \times 10^{-1}$ Torr, and the space within the exposure chamber and surrounding the differential pumping section 8 is permeated with He gas from supply 15 at about atmospheric pressure P5. With this invention, since the pressure difference between the two chambers 2, 13 acting on the $Si_3N_4$ film of the separation window 9A is significantly smaller than 1 atmosphere, the $Si_3N_4$ film, even as thin as 1 μm, can well withstand the pressure difference. Because of its thinness, the $Si_3N_4$ separation film provides a 10% transmission factor for the soft X-ray 1 of a wavelength of 13.5 nm.

Figure 4:
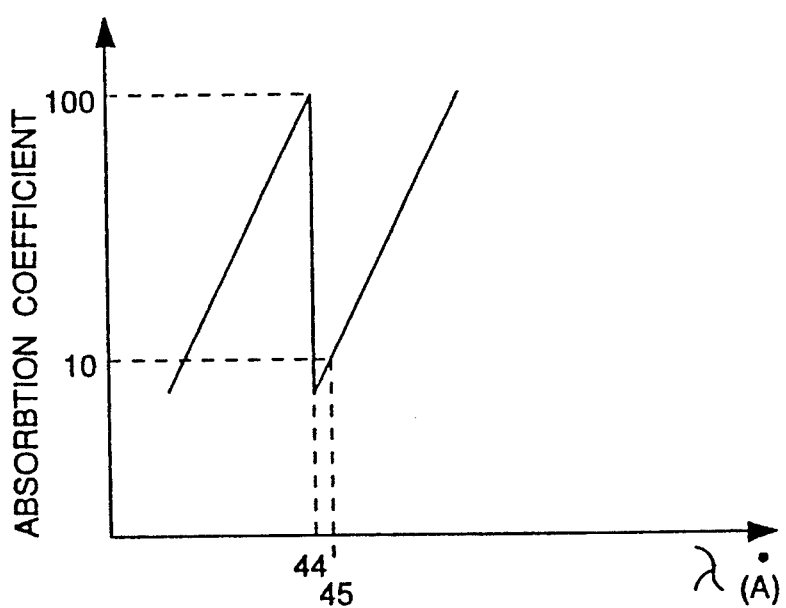
FIG. 4 shows window transmission characteristics.

The multi-layer film mirrors 4, 5, 6, 7 and 13B may be constructed such that one or more of their films is made of the same material as the material used in the thin film window 9, 9A or includes at least one of the chemical elements used in the material for constructing the thin film window 9, 9A. FIG. 4 shows the optical transmission characteristics of the thin film window 9, 9A. The absorption coefficient of the window material is plotted verses the wavelength, in angstroms, of the X-ray beam 1. For this plot, it is noticed that the absorption coefficient increases with increasing wavelength up to a wavelength of 44 angstroms, and then the coefficient drops at an absorption edge from a high absorption coefficient, for example 100 to a lower absorption coefficient, for example 10. Thereafter, the absorption coefficient again increases with increasing wavelength. If the wavelength of the X-ray is chosen to be slightly greater than the wavelength of an X-ray absorption edge, it is seen that the transmission of the window is at maximum for its particular thickness, that is the transmission is maximum for the given strength of the window. In the particular example shown in FIG. 4, the wavelength of the X-ray is chosen to be 45 angstroms, whereas the absorption edge of the window material is at 44 angstroms.

Figure 2:
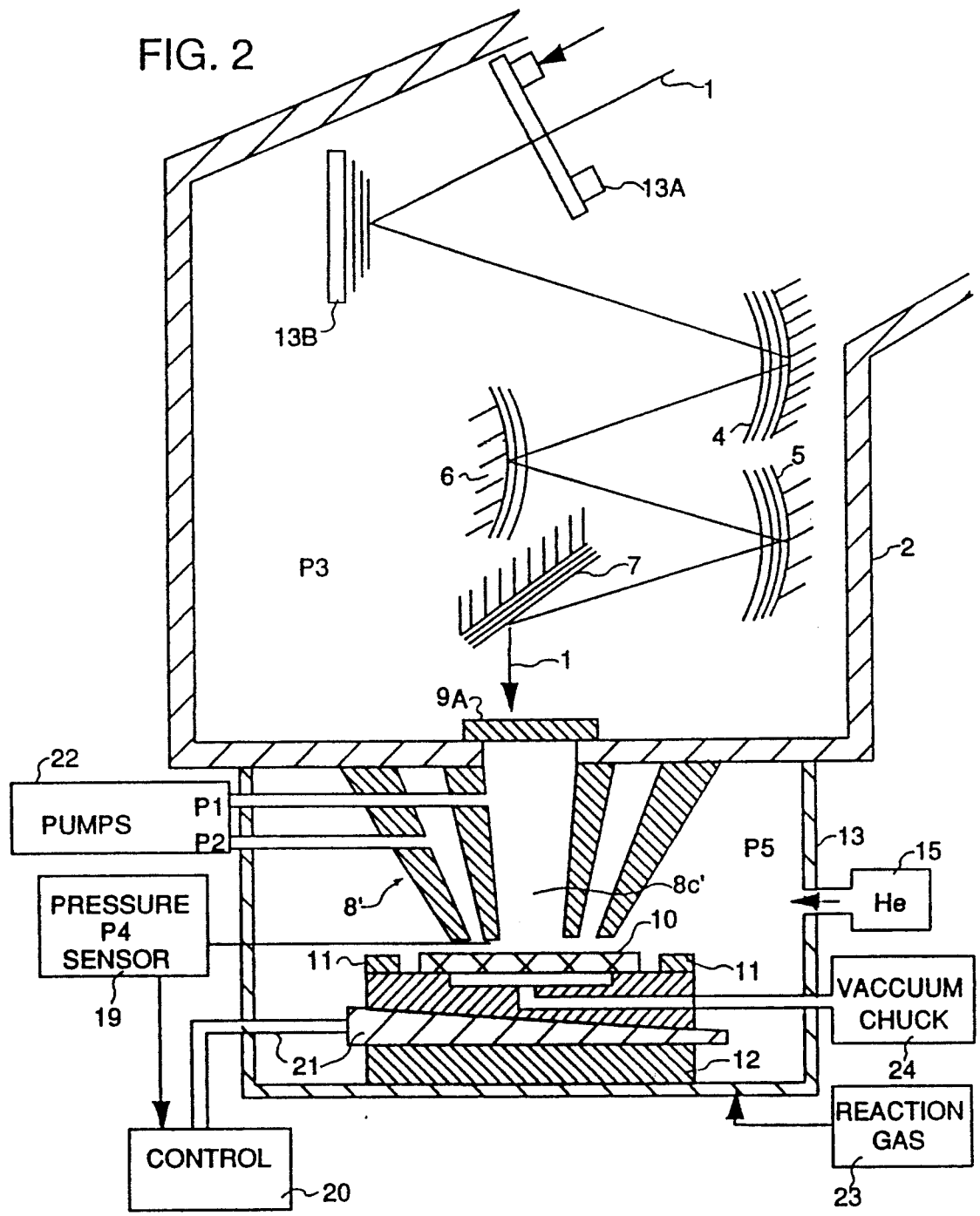
FIG. 2 is a cross sectional view of the wafer exposure chamber employed in the second embodiment.

FIG. 2 differs from FIG. 1 in that the reduction optical system of FIG. 2 employs a transmission mask, whereas the reduction optical system of FIG. 1 employs a reflection mask. Further, the differential pumping mechanism of FIG. 2 is different from that of FIG. 1, namely FIG. 2 employs concentric conical pumping pressure sections wherein $P5 > P2 > P4 > P1 > P3$.

In FIG. 2, although equally applicable to FIG. 1, there is shown a pressure sensor 19 for sensing the pressure at the projection surface of the substrate 10 and providing a correlated signal to a control 20. The control 20 will move a mechanical mechanism 21, such as the illustrated wedge to maintain the pressure P4 equal to a constant, K. The movement of the wedge to the left in FIG. 2 will move the wafer sample 10 away from the inlet opening of the differential pumping mechanism 8, to correspondingly adjust the gap between the wafer and the differential pumping mechanism. Adjustment of this gap will correspondingly adjust the pressure P4, which will correspondingly adjust the pressures P1 and P2, which ultimately adjusts the pressure differential across the window 9. The purpose of the adjustment mechanism is to maintain constant the pressure differential across the window 9.

As shown in FIG. 1, although equally applicable to FIG. 2, the stage 12 may be moved laterally to a position where the wafer 10 may be easily removed. The retractor 11, which is the same height of the wafer 10, will thereby move beneath the inlet opening of the differential pumping mechanism to maintain the above mentioned gap thereby maintained the above mentioned pressure differential across the window 9 during replacement of the wafer 10. Replacement of the wafer 10 is thereby made to be quite simple and the pressure differential across the window is maintained. The wafer replacement is also made simple in that the general environment of the space within the exposure chamber 13 is at atmospheric pressure, so that vacuum and handling equipment may be easily used. Pumping means 22, as shown, will maintain the pressures P1, P2 and P3 relative to the general atmospheric pressure P3. If a wafer is not immediately replaced, a dummy wafer may be placed within the retractor when it is returned to its position to maintain the gap. Reaction gas 23 and may be provided to the chamber 13. The reactive gas is such that a resist or semiconductor material of the sample substrate is selectively etched or deposited upon by using the X-ray beam, and wherein the reactive gas uses an organic monomer, the substrate has a resist polymer irradiated with the X-ray beam to form a radiation-induced graft copolymerization, so that the resist not exposed can be dissolved by a developing solution to form a pattern.

Each of the multi-layer mirrors 4, 5, 6, 7 and 13B is preferably made of alternating layers of light material and heavy material. For example, the light material may be silicon and the heavy material may be malimunum. The light material is chosen as a highly transparent material. Therefore, it is advantageous to form the window 9, 9A of the same material as the light material, for example silicon. Therefore, materials mentioned above for the window can also be used for the light materials of the multi-layered mirrors. Further, the reflective mask 3 may employ the same alternating light and heavy layers as the mirrors 4, 5, 6 and 7. A vacuum chuck 24, per se conventional in chip handling for other apparatus, may be used in the optical reduction projection lithographic apparatus, because of the present invention that permits atmospheric, or near atmospheric pressure P5 in chamber 13.

This invention separates the optical system chamber and the exposure chamber in the reduced projection type X-ray lithography apparatus and keeps them in different ambient pressure states. As a result, the following advantages are obtained.

(1) Contamination of the surfaces of the optical mirrors and the X-ray mask with gases, which are produced when the resist decomposes during exposure, can be prevented.

(2) Since the exposure chamber is at atmospheric pressure, the replacement of the wafer can be done in one-tenth the time taken by the conventional apparatus, improving the exposure productivity about five-fold. Furthermore, under atmospheric pressure, a vacuum chuck can be employed for holding the wafer of the stage, improving the exposure precision over the conventional mechanical holding method.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A reduction optical projection type X-ray lithography apparatus, comprising:
   a chamber forming a first space;
   means for providing an X-ray beam;
   an X-ray mask and optical devices for focusing the X-ray beam being within said chamber;
   means for holding a substrate in a second space outside said chamber;
   a differential pumping mechanism and a thin-film window separating the first and second spaces, and passing the focused X-ray beam from the first space to the second space for projection onto the substrate; and
   wherein the thin-film window has a profile of varying thickness to correct an X-ray intensity profile on the surface of the substrate produced by the optical devices.

2. A reduction projection type X-ray lithography apparatus as claimed in claim 1, including means for setting the first space for the optical devices at a pressure of less than $1 \times 10^{-6}$ Torr.

3. A reduction projection type X-ray lithography apparatus as claimed in claim 2, including means maintaining the pressure in the second space at a projection surface of the substrate in a pressure range higher than $1 \times 10^{-6}$ Torr but lower than atmospheric pressure.

4. A reduction projection type X-ray lithography apparatus as claimed in claim 3, including means providing an atmosphere in the second space of a gas other than air.

5. A reduction projection type X-ray lithography apparatus as claimed in claim 3, wherein said differential pumping mechanism provides substantially atmospheric pressure adjacent the means for holding a substrate and provides a pressure differential lower than 1 Torr across the thin-film window.

6. A reduction projection type X-ray lithography apparatus as claimed in claim 5, wherein said means for holding includes a vacuum chuck.

7. A reduction projection type X-ray lithography apparatus as claimed in claim 1, wherein the thin-film window is formed with a grid or support frame to reinforce the window.

8. A reduction projection type X-ray lithography apparatus as claimed in claim 1, wherein said differential pumping mechanism is in the second space and provides a stepwise distribution of vacuum level between the thin-film window and the substrate.

9. A reduction projection type X-ray lithography apparatus as claimed in claim 1, wherein said differential pumping mechanism provides substantially atmospheric pressure adjacent the means for holding a substrate and provides a pressure differential lower than 1 Torr across the thin-film window.

10. A reduction projection type X-ray lithography apparatus as claimed in claim 1, wherein the thin-film window is formed of one or more of Be, B, C (diamond), BN, $B_4C$, Si, $SiO_2$, $Si_3N_4$, and SiC.

11. A reduction projection type X-ray lithography apparatus as claimed in claim 1, wherein the wavelength of the X-ray beam is slightly longer than an X-ray absorption edge wavelength in the thin-film window.

12. A reduction projection type X-ray lithography apparatus as claimed in claim 1, including means introducing a reactive gas into the second space and the reactive gas being such that a resist or semiconductor material of the substrate is selectively etched or deposited by using the X-ray beam.

13. A reduction projection type X-ray lithography apparatus as claimed in claim 12, wherein the reactive gas uses an organic monomer, the substrate has a resist polymer irradiated with the X-ray beam to form a radiation-induced graft copolymerization, so that the resist not exposed can be dissolved by a developing solution to form a pattern.

14. A reduction optical projection type X-ray lithography apparatus, comprising:
   a chamber forming a first space;
   means for providing an X-ray beam;
   an X-ray mask and optical devices for focusing the X-ray beam being within said chamber;
   means for holding a substrate in a second space outside said chamber;
   a differential pumping mechanism and a thin-film window separating the first and second spaces, and passing the focused X-ray beam from the first space to the second space for projection onto the substrate; and wherein the optical devices include multi-layer film mirrors, and one of the films making up the multi-layer film mirrors is made of the same material as the thin-film window or includes at least one of chemical elements used in the material of the thin-film window.

15. A reduction optical projection type X-ray lithography apparatus, comprising:
   a chamber forming a first space;
   means for providing an X-ray beam;
   an X-ray mask and optical devices for focusing the X-ray beam being within said chamber;
   means for holding a substrate in a second space outside said chamber;
   a differential pumping mechanism and a thin-film window separating the first and second spaces, and passing the focused X-ray beam from the first space to the second space for projection onto the substrate; and
   means operative when, after exposure, the wafer is replaced, for maintaining the pressure differential across the thin-film window substantially constant.

16. A reduction optical projection type X-ray lithography apparatus, comprising:
   a chamber forming a first space;
   means for providing an X-ray beam;
   an X-ray mask and optical devices for focusing the X-ray beam being within said chamber;
   means for holding a substrate in a second space outside said chamber;
   a differential pumping mechanism and a thin-film window separating the first and second spaces, and passing the focused X-ray beam from the first space to the second space for projection onto the substrate; and
   means measuring the pressure on the side on the substrate facing said differential pumping mechanism and means for adjusting a gap between the differential pumping mechanism and the substrate so that the measured pressure remains constant.

17. A reduction projection type X-ray lithography apparatus as claimed in claim 16, including means operative when, after exposure, the substrate is replaced, for maintaining the gap constant to keep the pressure differential across the thin-film window substantially constant.

18. A reduction projection type X-ray lithography apparatus as claimed in claim 17, including means for setting the first space for the optical devices at a pressure of less than $1 \times 10^{-6}$ Torr;
   including means maintaining the pressure in the second space at a projection surface of the substrate in a pressure range higher than $1 \times 10^{-6}$ Torr but lower than atmospheric pressure; and
   wherein said differential pumping mechanism provides substantially atmospheric pressure adjacent the means for holding a substrate and provides a pressure differential lower than 1 Torr across the thin-film window.

19. A reduction projection type X-ray lithography apparatus as claimed in claim 18, wherein said means for holding includes a vacuum chuck.

* * * * *